Figure 1:
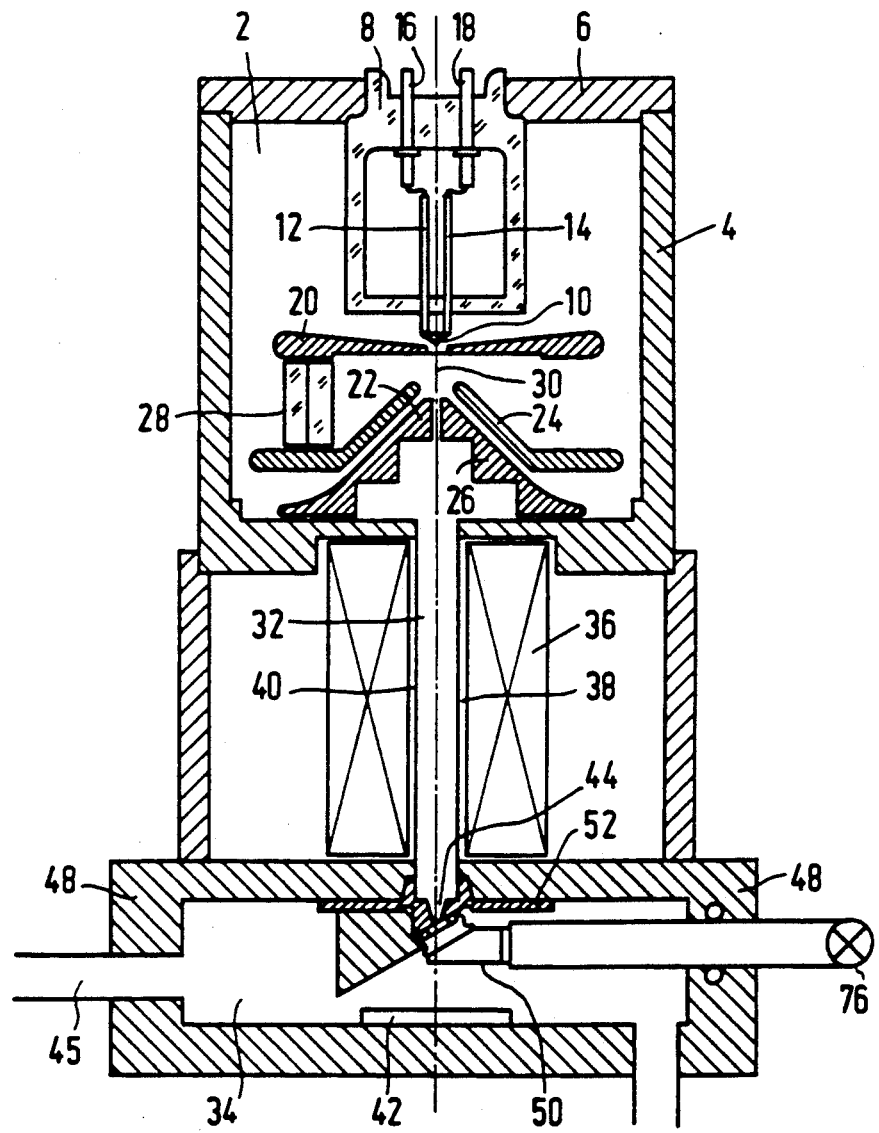

United States Patent [19]

Tappel et al.

[11] Patent Number: 5,093,578
[45] Date of Patent: Mar. 3, 1992

[54] VALVE DEVICE FOR A PARTICLE BEAM APPARATUS

[75] Inventors: Hendrik G. Tappel; Hendrik N. Slingerland, both of Eindhoven, Netherlands

[73] Assignee: U.S. Philips Corporation, New York, N.Y.

[21] Appl. No.: 638,229

[22] Filed: Jan. 7, 1991

[30] Foreign Application Priority Data

Jan. 10, 1990 [NL] Netherlands ..................... 9000056

[51] Int. Cl.⁵ .............................................. H01J 37/20
[52] U.S. Cl. .............................. 250/441.11; 250/440.11
[58] Field of Search ................. 250/441.1, 440.1, 310, 250/311; 313/7

[56] References Cited

U.S. PATENT DOCUMENTS

| | | | |
|---|---|---|---|
| 2,508,317 | 5/1950 | Verhoeff | 250/441.1 |
| 2,666,539 | 1/1954 | Avery | 250/441.1 |
| 4,020,353 | 4/1977 | Saito et al. | 250/441.1 |
| 4,241,259 | 12/1980 | Feuerbaum et al. | 250/441.1 |
| 4,833,362 | 5/1989 | Crewe | 313/7 |

Primary Examiner—Jack I. Berman
Assistant Examiner—Kiet T. Nguyen
Attorney, Agent, or Firm—Paul R. Miller

[57] ABSTRACT

A particle beam apparatus comprises a valve device which is arranged between a high-vacuum space and a further vacuum space and which serves to open and close a pump aperture. The valve device comprises a valve whereto a translatory movement can be externally imparted. A movement in a direction other than that of the translatory movement is imparted to the valve by cooperation between a valve head and an abutment face prior to the actual closing. To this end, the valve is provided, for example with a leaf spring construction and a ball bearing may be included between the abutment space and the valve head.

12 Claims, 2 Drawing Sheets

VALVE DEVICE FOR A PARTICLE BEAM APPARATUS

The invention relates to a particle beam apparatus, provided with a vacuum chamber comprising a diaphragm device and which serves to accommodate a particle beam emitter, with a charged-particle optical system, and with a valve device for opening and closing the diaphragm device, and also relates to a valve device for a particle beam apparatus.

The PCT patent application number WO 88/02180 describes a particle beam apparatus of this kind in the form of an electron beam apparatus. The described apparatus comprises an emission chamber with a diaphragm device that can be opened and closed. Opening and closing of the diaphragm device is realised by means of a displacement mechanism for an emission source. Such control is comparatively complex, is dependent on another element to be displaced, and the closing per se is not always sufficient; moreover, the valve device is subject to substantial wear because surfaces slide one over the other. In particle beam apparatus there is a need for a simple, externally operable, extremely reliable valve device combining adequate closing and a long service life.

It is an object of the invention to mitigate the described drawbacks and to satisfy the described requirements; to achieve this, a particle beam apparatus of the kind set forth in accordance with the invention is characterized in that within a path of motion for opening or closing a valve of the valve device moves in a direction transversely of a seat of the diaphragm device.

Because the valve in such a valve device moves in a direction transversely of a seat during such opening and closing of the diagraphm device, no friction will occur between the valve and the seat and hence, even in the case of tight closing, no wear will occur. Moreover, the use of a usually less reliable rotating valve is avoided.

The valve in a preferred embodiment moves along a positioning path between a position within a particle beam path and a position outside a particle beam path and a path of motion, intended to cover herein the closing as well as the opening, is externally activated as a single translatory movement. The seat of the diaphragm device encloses an angle other than 90° with respect to the beam path at that area, for example an angle of approximately 60°.

In a further preferred embodiment, within the path of motion the valve cooperates with abutment means in order to displace the valve in a direction transversely of the seat. The valve device notably comprises a leaf spring construction which supports the valve and which transfers a translatory movement to the valve and at the same time enables through bending, a movement of the valve in a direction other than the translatory direction. In directions transversely of the latter movement direction, the leaf spring construction is rigid. Friction is thus prevented between components of the device and a high reliability is achieved. Between the valve and the abutment means there may be included a ball bearing in order to avoid a residual sliding movement which could give rise to wear. The abutment means can support the ball bearing and be provided with a leaf spring for the motion of the valve. The ball bearing may also be mounted in a support for the valve, in which case the freedom of movement in a direction transversely of the seat can be taken over by the leaf spring construction of the valve device, so that a single leaf spring construction suffices.

In a preferred embodiment the valve is closed under spring pressure and is moved to an open position by an externally applied force, for example a pneumatically applied force using a piston transmission, for the translatory movement.

A preferred embodiment of the valve device consists of a common housing which can be comparatively simply mounted in a particle beam apparatus, a valve which is supported by a leaf-spring system and a transmission, and abutment means for the motion of the valve.

Figure 2:
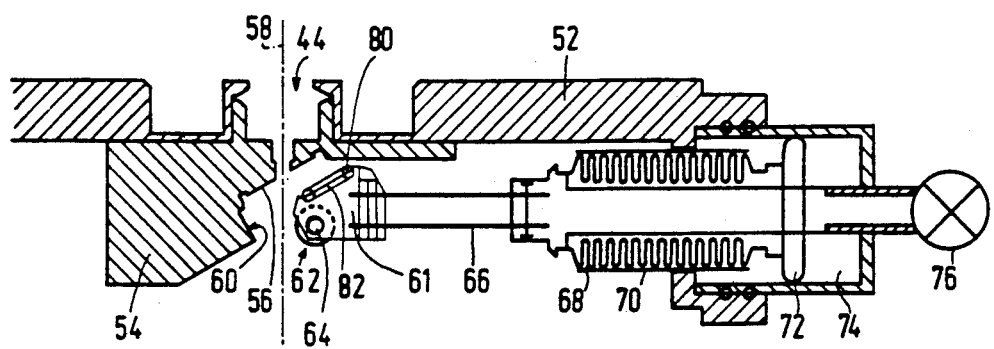
Figure 3:
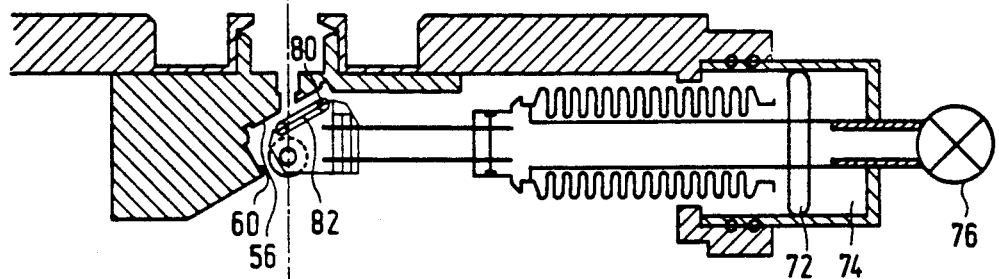
Figure 4:
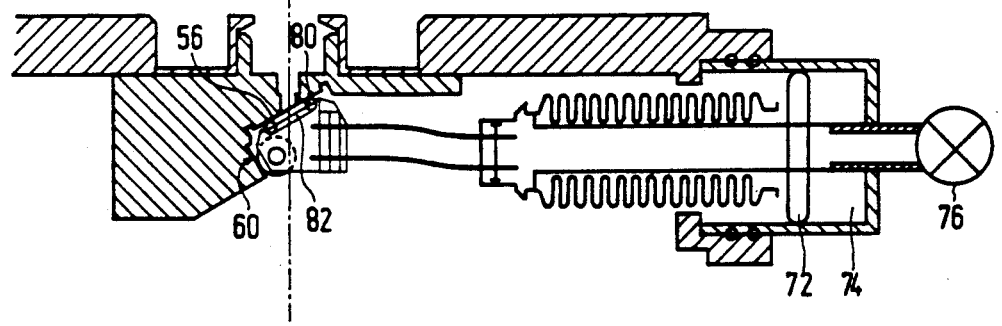

Some preferred embodiments in accordance with the invention will be described in detail hereinafter with reference to the drawing. Therein:

FIG. 1 shows an embodiment of a particle beam apparatus in accordance with the invention, FIGS. 2, 3 and 4 show an embodiment of an appropriate valve device in different stages.

FIG. 1 diagrammatically shows the following elements of an electron beam apparatus in accordance with the invention: a first vacuum chamber 2 which is enclosed by a cylindrical wall portion 4 of the apparatus, and a lid 6 on which an emitter holder 8 of an emitter 10 is mounted. The emitter comprises supply leads 12 and 14 with pasages 16 and 18 which are provided in the electrically insulating holder 8. In the space 2 there are also provided a control electrode 20 and an anode system 22 which comprises a first anode 24 and a second anode 26. Via, for example a ceramic construction 28, the anode system 22 forms an electrically insulating unit with the control grid 20. An electron beam 30 to be emitted by the emitter enters a working space 34 via a vacuum space 32, while tranversing a coil system 36 for modulation, deflection and/or alignment of the beam. A space 38 for the mounting of electronoptical components, for example a focussing coil and/or reflection coils is closed in a vacuum tight manner by a pipe 40. In the space 34 there is arranged, for example an object 42 to be examined or treated. An object of this kind is arranged so as to be exchangeable in the space 34 of the apparatus. When the object is exchanged, the vacuum in the space 34 is partly or completely lost. Moreover, when an object is irradiated gas may be released in the space 34. In order to achieve an acceptably long evacuation process for the space 2, an opening 44 which is not excessively small is required between the two spaces. The space 34 will be evacuated preferably via a pump outlet 45, because a pump outlet connected to the space 2, being a sensitive high-vacuum space, can better be avoided. Thus it is already necessary to provide a closing facility for the opening 44.

A preferred embodiment of a valve device 50 is shown in detail in FIG. 2 and comprises a support 52 for the diaphragm device 44 which can be mounted on a wall portion 48. An abutment means 54, mounted on the support 52, comprises a seat 56 which encloses an angle other than 90°, for example an angle of 60°, with respect to a beam axis 58 of the particle beam 30. The abutment means 54 also comprises an abutment face 60 which is contacted by a valve 62 after the latter has been moved to a desired position in the beam path and hence is moved in a direction of the abutment face. In order to avoid friction between the abutment face 60 and a valve head 61 of the valve 62 during the latter movement, the valve head is provided with a ball bearing 64 which cooperates with the abutment face. In the present embodiment the ball bearing is accommodated in the valve, but it may also be mounted on the abutment means 54. The valve also comprises a spring construction 66 in order to enable movement of the valve head in a direction other than the movement direction of the valve as a whole, without leading to freedom of movement in other directions or rotations. Translation of the valve is in this case realised by means of a vacuum bellows 68 which is inserted in a guide 70 and is connected to a piston element 72 which is accommodated in a pressure chamber 74. The valve can be placed in an open position by reducing the pressure in the pressure chamber. The closed position of the valve corresponds to a rest state of a pneumatic control system 76. This prevents incorrect positioning of the valve in situations where such an incorrect position is detrimental to the high vacuum chamber.

During the last phase of a closing or opening motion of the valve, the abutment face pushes the valve head in a direction of the seat. A support 80 for a beam diaphragm 82 is then directed parallel to the seat. It is to be noted that a bending angle of the leaf-spring system need only be small, so that the diaphragm support actually is always directed substantially parallel to the abutment face. A vacuum seal may be provided between the diaphragm support 80 and the seat 56; however, because use is made of a good flatness seal with a comparatively high pressure, a simple metal-to-metal joint usually suffices. It is to be noted that the beam diaphragm is always open and a closure between the working space and the high vacuum space make sense only in the case of a, be it less severely, evacuated working space.

We claim:

1. A particle beam apparatus comprising
a vacuum chamber,
particle beam emitter means within said vacuum chamber for emitting particle beams,
charged particle optical means for guiding said particle beams,
diaphragm means having a diaphragm seat defining an opening for passing said particle beams, and
valve means for opening and closing said diaphragm means, said valve means including a valve being movable substantially transversely to said diaphragm seat.

2. A particle beam apparatus according to claim 1, wherein said valve means includes means for externally moving said valve in a single translatory motion of a positioning path, said positioning path being defined between an opening path of said particle beams and a closing path of said particle beams.

3. A particle beam apparatus according to claim 2, wherein said valve cooperated with abutment means for displacing said valve in a direction different from said positioning path.

4. A particle beam apparatus according to claim 3, wherein a ball bearing is disposed between said valve and said abutment means.

5. A particle beam apparatus according to claim 1, wherein said diaphragm seat is disposed at an angle other than 90° with respect to said particle beams at said opening.

6. A particle beam apparatus according to claim 1, wherein said valve means includes leaf spring means for imparting freedom of movement to said valve in a single direction different from a positioning path.

7. A particle beam apparatus according to claim 6, wherein a ball bearing is disposed between said valve and said abutment means.

8. A particle beam apparatus according to claim 1, wherein abutment means having a leaf spring is included for displacing said valve.

9. A particle beam apparatus according to claim 8, wherein a ball bearing is disposed between said valve and said abutment means.

10. A particle beam apparatus according to claim 1, wherein abutment means for displacing said valve is rigidly disposed with respect to said diaphragm means, said valve being provided with a ball bearing.

11. A particle beam apparatus according to claim 1, wherein said valve means includes means for moving said valve into a closing position of said opening under spring pressure and means for moving said valve into an open position of said opening under an externally applied force.

12. A valve device comprising
valve means for opening and closing an opening,
drive means including a leaf spring system for externally moving said valve means in a translation direction relative to said opening, and
abutment means for moving said valve means in a direction different from said translation direction.

* * * * *